// United States Patent [15] 3,667,000
Bergmans [45] May 30, 1972

[54] INTEGRATED HALL-EFFECT DEVICE

[72] Inventor: Hendrik Jan Bergmans, Emmasingel, Eindhoven, Netherlands

[73] Assignee: U.S. Philips Corporation, New York, N.Y.

[22] Filed: Aug. 25, 1969

[21] Appl. No.: 852,644

[30] Foreign Application Priority Data

Aug. 31, 1968 Netherlands..........................6812451

[52] U.S. Cl.....................317/235 R, 317/234 G, 317/235 H
[51] Int. Cl..........................................................H01l 5/00
[58] Field of Search.........................................317/234, 235

[56] References Cited

UNITED STATES PATENTS

| | | | |
|---|---|---|---|
| 3,413,713 | 12/1968 | Helda et al | 29/588 |
| 2,877,394 | 3/1959 | Kuhrt | 317/234 |
| 3,239,786 | 3/1966 | Shang | 338/32 |
| 3,050,698 | 8/1962 | Brass | 332/51 |
| 3,192,471 | 6/1965 | Kuhrt et al | 324/45 |

FOREIGN PATENTS OR APPLICATIONS

| | | | |
|---|---|---|---|
| 1,118,284 | 6/1968 | Great Britain | 317/250 |

OTHER PUBLICATIONS

IBM Technical Disclosure Bulletin, Vol. 6, No. 6, Nov. 1963 " Semiconductor Housing," M. Michelitsch

*Primary Examiner*—John W. Huckert
*Assistant Examiner*—E. Wojciechowicz
*Attorney*—Frank R. Trifari

[57] ABSTRACT

An integrated Hall-effect device is described in which a part of a semiconductor body serves as a Hall element and in which an amplifier circuit is incorporated in the remaining part, which semiconductor body is connected to conductors and is incorporated in an envelope of synthetic material. The envelope at the area of the lower and upper side of the Hall element contains recesses extending to the proximity of the semiconductor body in which poleshoes of a ferromagnetic material can be incorporated in order to concentrate the magnetic field at the Hall element.

4 Claims, 4 Drawing Figures

*INVENTOR.*

HENDRIK JAN BERGMANS

*BY*

Frank R. Trifari

AGENT

Figure 1:
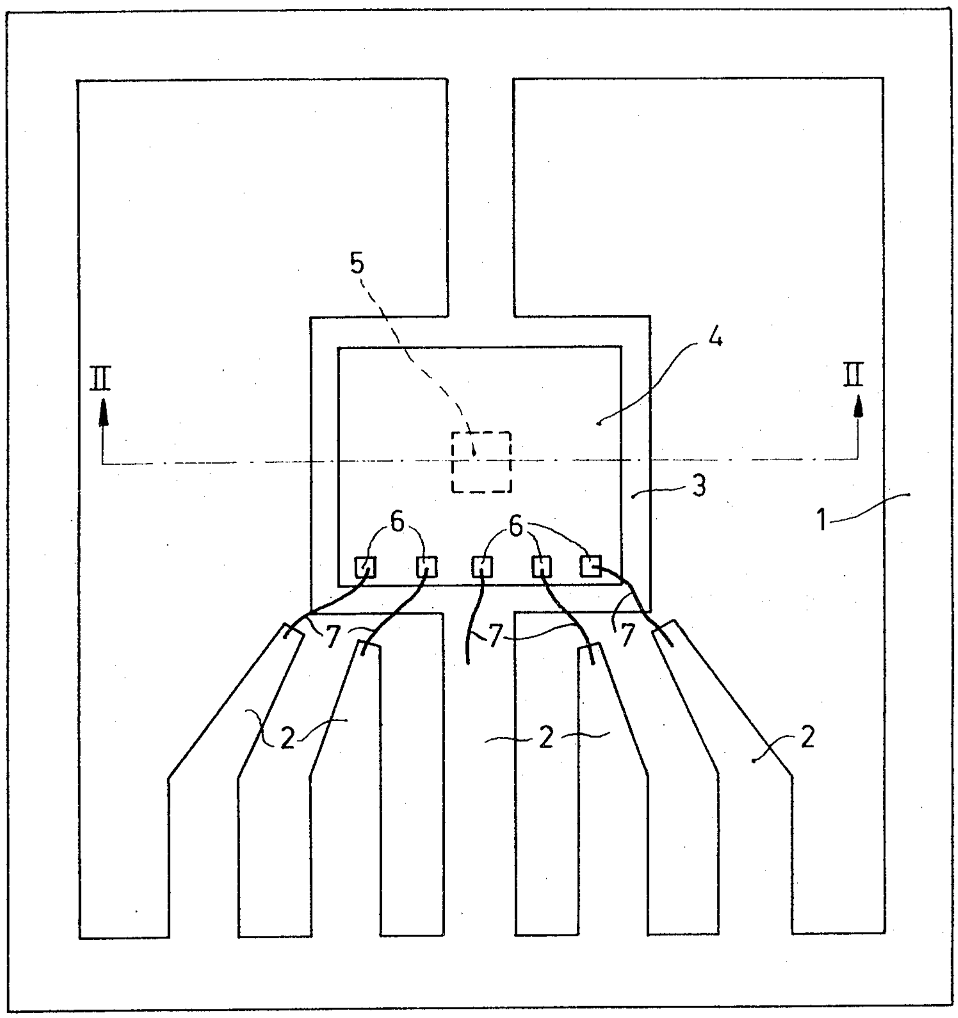

INVENTOR.
HENDRIK JAN BERGMANS
BY
Frank R. Trifari
AGENT

INTEGRATED HALL-EFFECT DEVICE

The invention relates to an integrated Hall-effect device in which a part of a semiconductor body serves as a Hall element and in which an auxiliary circuit associated with the Hall element is integrated in the remaining part of the semiconductor body.

Semiconductor bodies of a particularly small thickness and having a large mobility of the free charge carriers, for example, indium antimonide, indium arsenide, are inter alia used for Hall elements. In this case, an amplifier circuit for the Hall elements cannot be integrated in the semiconductor body. It is also known to use semiconductor bodies, for example, a plate of silicon, as a substrate for the Hall element. In this case the ancillary circuit can indeed be integrated in the semiconductor body. A simple manufacture is possible and a favorable operation of the Hall-effect device is also obtained. These Hall-effect devices may advantageously be used, for example, in commutator-less electric motors in which the currents through the coils are switched by means of Hall elements. U.S. Pat. No. 3,522,494, assigned to the same assignee, describes several such constructions.

It is desirable to provide said integrated Hall-effect device in an envelope which protects the device from external influences and which must have a rigid construction so that the device can be readily handled. The possibility must be available to obtain a transverse magnetic field of a sufficient strength at the area of the Hall element, with which magnetic field electric Hall signals can be produced. In order to achieve this, according to the invention the semiconductor body is secured to a support which forms part of a grid of conductors, contact places of the semiconductor body being electrically conductively connected to the ends of the said conductors, the grid with the semiconductor element being situated in an envelope of synthetic material in which at the area of the lower and upper side of the Hall element a recess is provided which extends to the proximity of the semiconductor body. The envelope according to the invention fully meets the requirements imposed. In the recesses of the envelope which are situated above and below the Hall element, poleshoes of a ferromagnetic material may be provided which may extend to the immediate proximity of the Hall element. The envelope according to the invention hence provides the possibility of obtaining a transverse magnetic field of a sufficient field strength, so that a good operation of the Hall-effect device is ensured.

In a favorable embodiment of the integrated Hall-effect device according to the invention, the recesses are conical, namely convergent in the direction of the Hall element. Due to the gradual variation of the poleshoes fitting in said recesses a favorable concentration of the magnetic flux at the area of the Hall element is ensured.

In a further embodiment according to the invention pieces of ferromagnetic material are provided in the recesses and are incorporated in the envelope of synthetic material to form poleshoes to obtain the magnetic field of the Hall element. In this construction the poleshoes may already be incorporated in the Hall-effect device, which may be of advantage in many cases.

Figure 2:
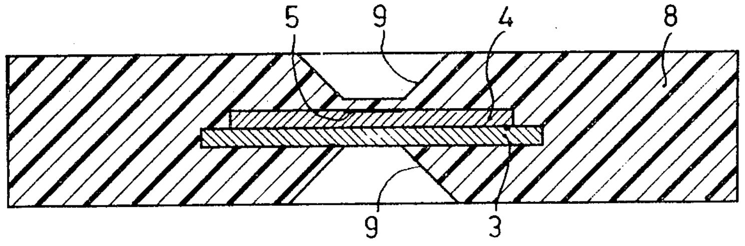
Figure 3:
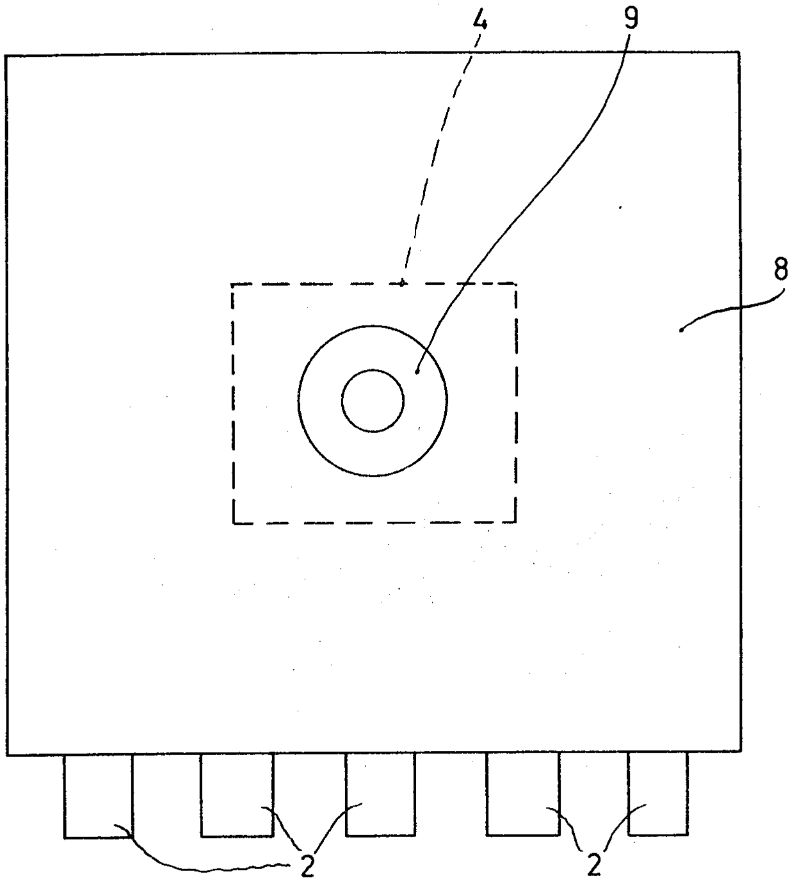
Figure 4:
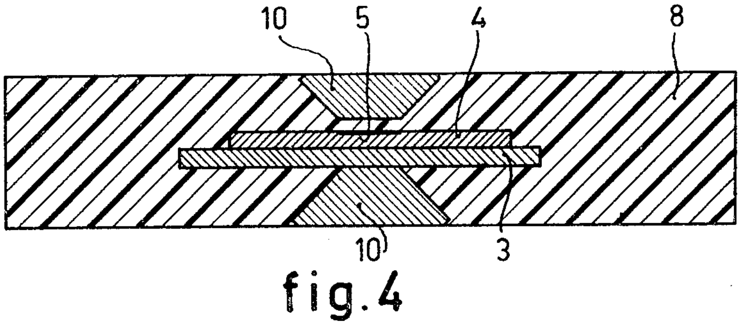

In order that the invention may be readily carried into effect, it will now be described in greater detail, by way of example with reference to the accompanying drawings, in which FIG. 1 shows a grid of conductors on which the semiconductor body is provided, FIGS. 2 and 3 are a cross-sectional view and a plan view, respectively, of an enveloped device according to the invention, FIG. 4 is a cross-sectional view of the Hall-effect device in which the poleshoes are incorporated in the envelope.

In FIG. 1, a grid 1 comprises a number of conductors 2. This grid is preferably formed from a thin plate of an iron-nickel alloy. One of the conductors 2 comprises a widened portion 3 on which a semiconductor body 4 in the form of a thin plate is provided. This semiconductor body may preferably consist of a silicon monocrystal which comprises an integrated circuit in which a Hall element and an amplifier circuit for the Hall signal is incorporated. The Hall element 5 will preferably be situated in the center of the semiconductor body 4 and is diagrammatically shown in broken lines. Contact places 6 on the semiconductor body are electrically connected to the conductors 2 of the grid by gold wires 7, by means of connection methods known per se. These wires 7 are situated so that they do not project above the Hall element 5.

The assembly thus formed is embedded in an envelope 8 of synthetic material; an embodiment of the enveloped Hall-effect device is shown in FIGS. 2 and 3. The part of the grid 1 which serves to keep the conductors 2 in the mutually desired position during the manufacture of the Hall-effect device is clipped. Upon enveloping, for example, in a mold, pins are provided in the matrix which extend up to the immediate proximity of the semiconductor body and which are situated exactly above and below the place where the Hall element 5 is present. In this manner recesses 9 are formed in the envelope 8 of synthetic material. These recesses enable poleshoes of a magnet to be provided in the immediate proximity of the Hall element, so that at the area of the Hall element a strong transverse magnetic field can be obtained, with which electric field Hall signals can be generated.

It is alternatively possible to incorporate the ferromagnetic poleshoes in the envelope. FIG. 4 shows an example hereof. As is shown, the poleshoes 10 may extend up to the outer surface of the envelope 8 of synthetic material but, if desirable, they may also slightly project from the envelope.

The recesses 9 are shown as being conical but they may have any different shape. A gradually convergent shape of the poleshoes, however, is favorable to obtain a concentration of the magnetic flux at the area of the Hall element.

What is claimed is:

1. An integrated Hall effect device comprising a semiconductor body having in one part a Hall element and in another part an electrical amplifier circuit connected to the Hall element and contact areas for the Hall element and amplifier circuit, an electrically conductive support for said semiconductor body, said support comprising a first electrically conductive portion for receiving the semiconductor body and a second electrically conductive portion comprising a grid of plural conductors having first end portions and opposite end portions with the first end portions adjacent the semiconductor body, said semiconductor body being mounted on the support's first portion, means electrically connecting the body contact areas and the conductor's first end portions, and an envelope of synthetic material enveloping the semiconductor body and the grid conductors leaving the opposite end portions free to serve as electrical terminals for the Hall-effect device, said synthetic material envelope having recesses located above and below the Hall element for receiving magnetic pole shoes which can be brought up close to the Hall element thereby increasing the magnetic flux density thereat in combination with magnetic pole shoes located in said recesses.

2. An integrated Hall effect device as set forth in claim 1 wherein the semiconductor body is wafer shaped, the Hall element extends in the plane of the wafer, and the recesses extend inward from the surface of the envelope substantially perpendicular to the plane of the wafer.

3. An integrated Hall-effect device as set forth in claim 2 wherein the recesses are each conical and convergent in the direction of the Hall element.

4. An integrated Hall-effect device as set forth in claim 1 wherein bodies of ferromagnetic material fill each of the recesses and are incorporated in the synthetic material envelope.

* * * * *